United States Patent [19]

Asprey

[11] Patent Number: 5,587,824
[45] Date of Patent: Dec. 24, 1996

[54] OPEN COLLECTOR COMMUNICATIONS LINK

[75] Inventor: Robert R. Asprey, Harvest, Ala.

[73] Assignee: Cybex Computer Products Corporation, Huntsville, Ala.

[21] Appl. No.: 524,189

[22] Filed: Sep. 1, 1995

Related U.S. Application Data

[63] Continuation-in-part of Ser. No. 736,568, Jul. 26, 1991, Pat. No. 5,323,420, which is a continuation-in-part of Ser. No. 55,829, Apr. 30, 1993, abandoned.

[51] Int. Cl.$^6$ ...................................................... H04B 1/52
[52] U.S. Cl. .......................... 359/154; 375/257; 345/168; 326/90; 370/284
[58] Field of Search ...................................... 359/154, 158, 359/162; 345/168; 326/30, 31, 86, 90; 370/27, 97; 375/257, 220

[56] References Cited

U.S. PATENT DOCUMENTS

| | | | |
|---|---|---|---|
| 4,162,371 | 7/1979 | Belforte | 370/27 |
| 4,797,582 | 1/1989 | Nguyen et al. | 307/345 |
| 4,885,718 | 12/1989 | Asprey et al. | 375/257 |
| 5,274,766 | 12/1993 | Long et al. | 345/168 |
| 5,523,703 | 6/1996 | Yamamoto et al. | 326/90 |

*Primary Examiner*—Wellington Chin
*Assistant Examiner*—Rafael Bacares
*Attorney, Agent, or Firm*—C. A. Phillips

[57] ABSTRACT

A bidirectional, long-distance open collector link is constructed between a pair of spaced-apart open collector ports, with each of the ports being coupled to one input of a comparator. The other input of the comparator is responsive to a reference voltage and the comparator of the opposite port via an extended conductor. A first diode poled to pass current from the respective port is coupled between inputs of each comparator, and a second diode is coupled in the extended conductor to pass current to the opposite port. As such, when a first port goes LOW, a first comparator operatively associated with that port provides a LOW to the input of the second comparator, causing it to provide a HIGH output and also pulls the second port LOW. The HIGH from the second comparator is used to clamp the first comparator LOW as long as the port asserts a LOW.

9 Claims, 4 Drawing Sheets

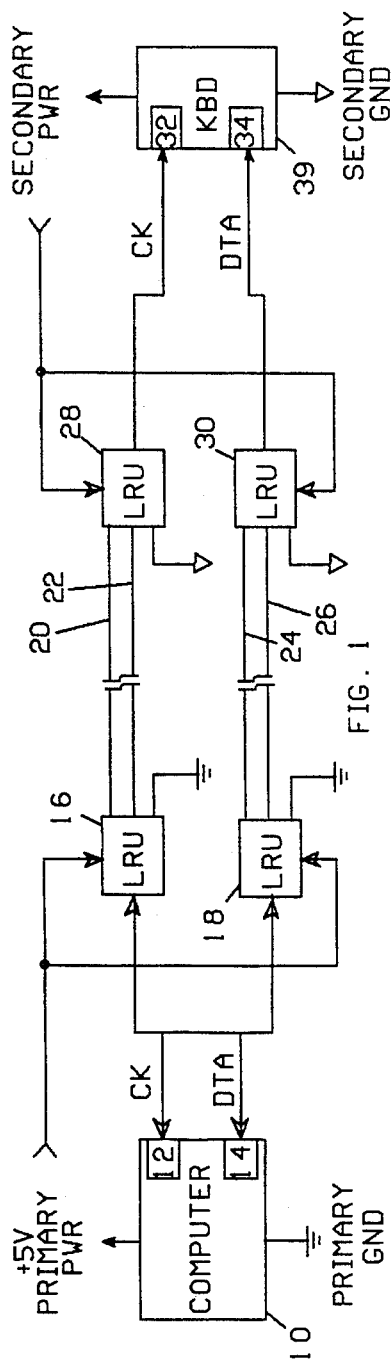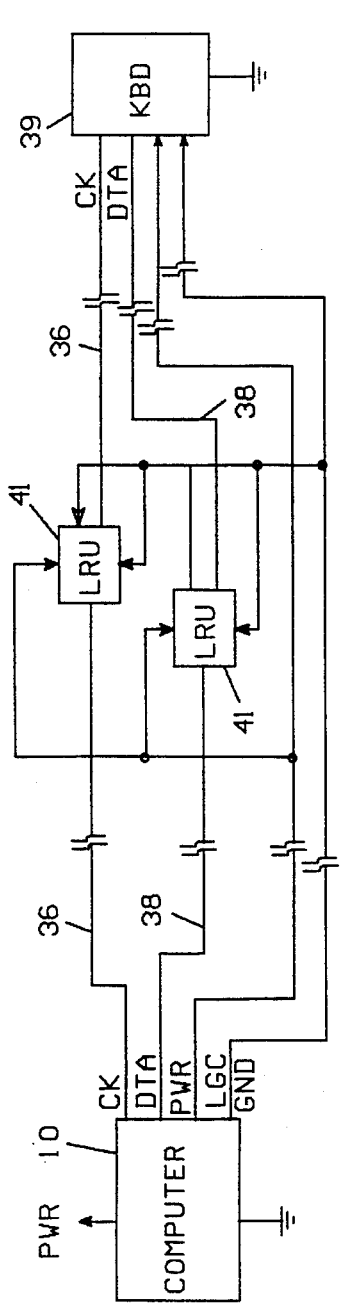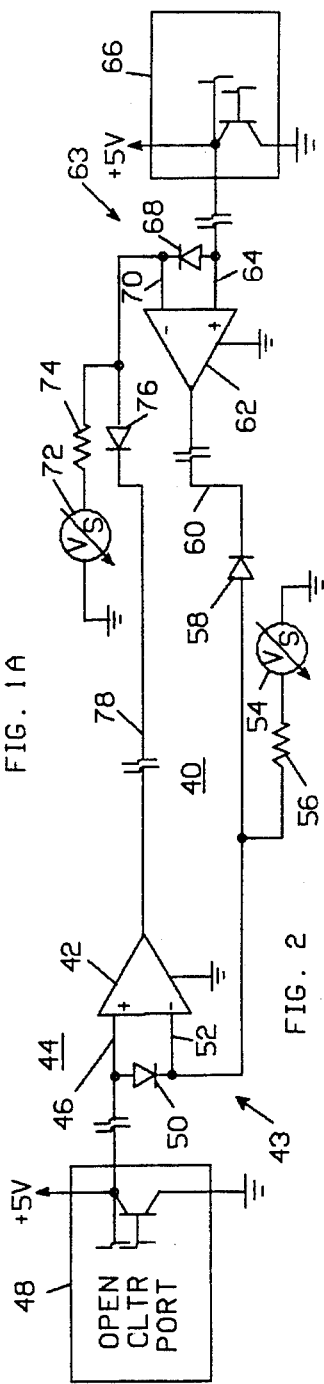

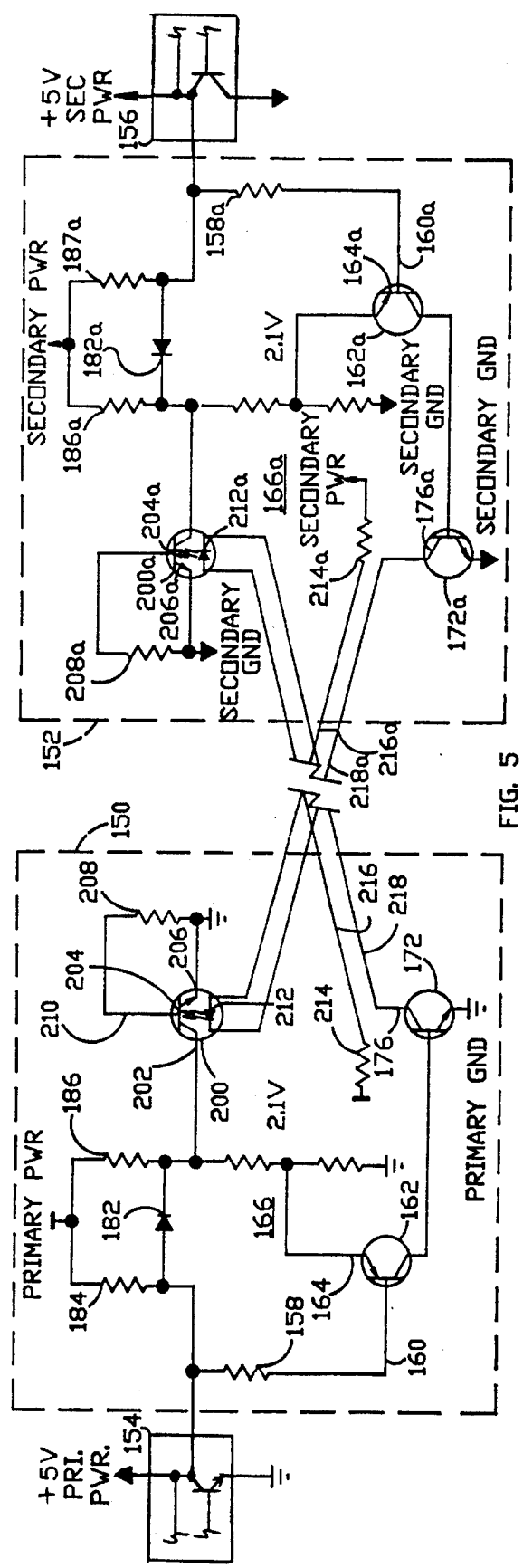
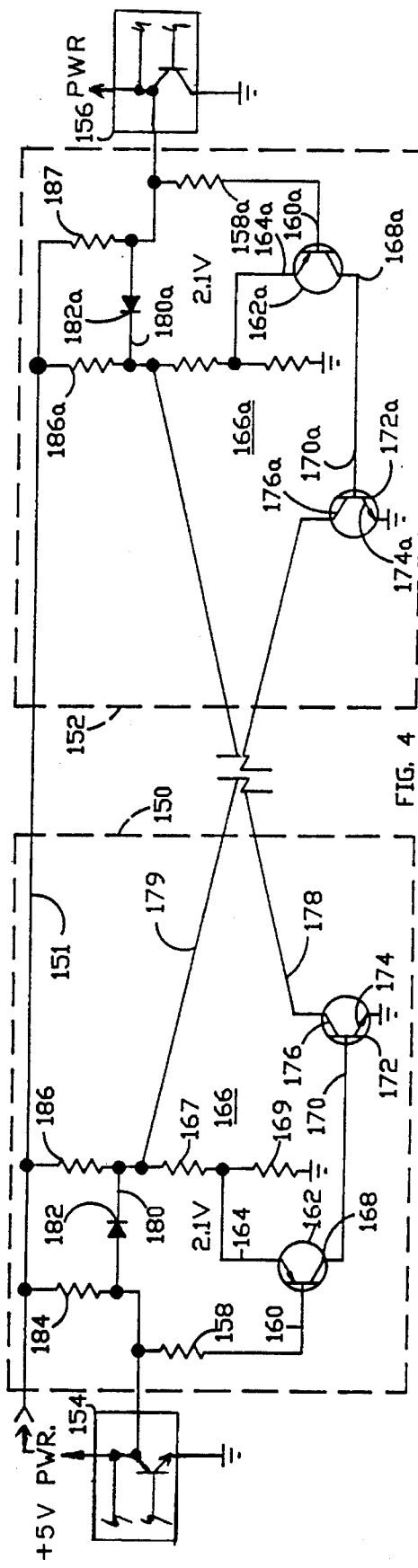
FIG. 5
FIG. 4

OPEN COLLECTOR COMMUNICATIONS LINK

CROSS REFERENCE OF RELATED APPLICATION

This application is a continuation-in-part of patent application Ser. No. 07/736,568, filed Jul. 26, 1991, now U.S. Pat. No. 5,323,420, which is a continuation-in-part of patent application Ser. No. 08/055,829, filed on Apr. 30, 1993 abandoned.

FIELD OF THE INVENTION

This invention relates to long-distance digital communications links, and particularly to open collector data transmission links such as those occurring between a computer and keyboard.

BACKGROUND OF THE INVENTION

At present, bidirectional digital data transmission between components of a system, such as occurs between a computer and a keyboard, is typically facilitated by transmitting and receiving circuitry configured in "open collector" configuration. As is conventional for this type of configuration, digital data from a port on each component is applied to a conductor coupling the components together, with a normal quiescent logic state of conductors of the data being a HIGH logic state, as represented by a voltage potential, such as +5 volts. In order to effect transmission of a digital data signal, the normally HIGH voltage potential is pulled to a LOW logic level by one of the components. This scheme is also characterized as active LOW, wherein components reading transmitted data are responsive to a falling voltage transition from a HIGH logic state to a LOW logic state.

While this scheme works well for relatively short communications links coupling the respective digital components, such as discrete conductors up to about 20 feet or so in length, long-distance coupling of open collector systems presents problems. Typically, such problems include signal attenuation by roll-off filters in the components, which are designed to reduce radiated electromagnetic interference, and attenuation by the long-distance conductors, which may reduce signal swing to a point where the digital signals will not reliably trigger digital devices. Also, where conductors conveying other types of signals, such as video signals, are located proximate the open collector conductors, induced noise therefrom may produce erroneous data bits. Further, where the respective open collector components are separated by distances on the order of thousands of feet, voltage offsets in ground potentials between the separated components may be such as to prevent one of the components from transitioning to a LOW logic level. This is particularly significant with TTL (transistor—transistor logic) systems wherein if the ground offset potential is above 800 millivolts, the upper limit for a TTL LOW logic level, unpredictable data transmission will result.

Applicant has devised several systems for long-distance digital data transmission, the most pertinent of which is patent application Ser. No. 07/736,568, filed on Jul. 26, 1991, now U.S. Pat. No. 5,323,420, by Robert R. Asprey and entitled "Circuitry For Regenerating Digital Signals in Extended Distance Communications Systems." Here, an input of a non-inverting buffer device having LOW and HIGH voltage thresholds with a hysteresis region therebetween is coupled to an open collector line and to a pull-up resistor, with an output of the buffer device coupled via a feedback resistor to the input. In this system, as a transition potential approaches one of the thresholds, additional current is provided to the conductor from the pull-up resistor and buffer device, which current serves to dampen noise as the transition potential crosses the threshold. Problems with it include lack of amplification, lack of threshold control, and the requirement of a common signal ground.

Accordingly, it is an object of this invention to provide a bidirectional, open collector, regenerative digital communications link that, in addition to eliminating the foregoing problems, may be extended thousands of feet and which in one embodiment may be powered by separate D.C. power supplies at respective ends of the communications link.

SUMMARY OF THE INVENTION

A long-distance communications link is provided for coupling spaced first and second digital bilateral communications ports of first and second communications stations. A first comparator responsive to the first port and a reference potential state provides a LOW output to a first conductor, and second comparator responsive to the second port and a second reference potential state signal provides a LOW output to the second conductor. A first voltage control reduces a voltage of the second port to a LOW logic level responsive to the LOW from the first comparator, and second voltage control reduces a voltage of the first port responsive to the LOW from the second comparator, transferring logic signals between the first and second ports. The occurrence of one of these reductions at one of the stations is communicated back to the other station to effect a holding of a low output during its presence at an originating port. Communications between stations may employ a single long-distance conductor and ground conductor from a port to a comparator or employ two such conductors between comparators plus ground.

BRIEF DESCRIPTION OF THE DRAWINGS

FIG. 1 is an example of one use of the present invention in one form of a long-distance communications link.

FIG. 1A is an example of a second use of the present invention, being used in a second form of a communications link, particularly as repeater circuitry in a communications link.

FIG. 2 is a schematic diagram of the present invention.

FIG. 4 is a schematic diagram of a third embodiment thereof.

FIG. 5 is a schematic diagram of a fourth embodiment thereof.

DESCRIPTION OF THE PREFERRED EMBODIMENT

Figure 3:
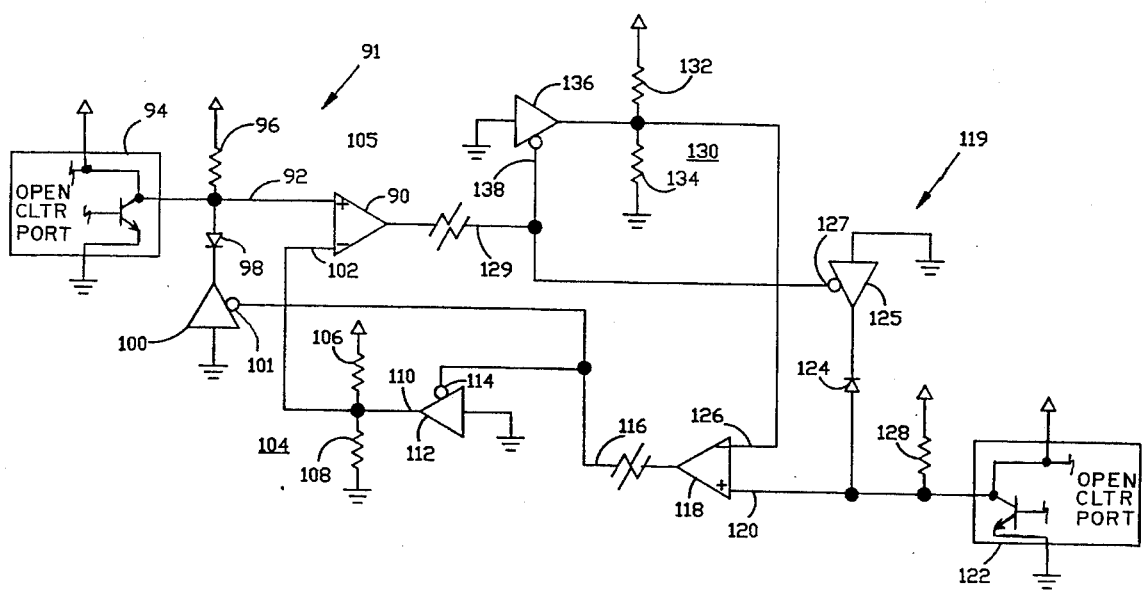
FIG. 3 is a schematic diagram of a second embodiment of the present invention.

Referring initially to FIG. 1, which illustrates by way of example one application of the present invention, a computer 10 is shown having bidirectional keyboard clock and data ports 12 and 14, respectively. The keyboard data port 14 serves to receive data streams from the keyboard, and with most computers, also serves to pass a signal from the computer to the keyboard to generate a clock pulse stream so the computer may provide data to the keyboard. The keyboard clock port 12 receives clock pulses from keyboard 39 concurrently with a received data stream and allows signals to be passed from the computer to inhibit operation of the keyboard by holding the clock line at a LOW logic state.

Electrically, these clock and data ports are each typically of open collector configuration, meaning that an output transistor of a port has a base input responsive to an active LOW logic signal from that port, a collector of the transistor is coupled to the communications conductor, and an emitter is coupled to ground. A HIGH logic level is the quiescent state on the conductor. At the transmitting port, a LOW logic transition applied to the port causes base current to flow, saturating the transistor and pulling the logic level on the conductor to a LOW potential. At the receiving port, the LOW logic level is coupled to the collector of the output transistor, which is biased to a high impedance state and is also coupled to receiving circuitry of the device and has no effect on the receiving output transistor. Thus, each of the clock and data ports are bidirectional; therefore, a single port of the computer passes signals bidirectionally.

The bidirectional open collector ports on computer 10 are coupled to clock and data transmitter and receiver logic low level reducer units LRD 16 and 18 and which enables the bidirectional ports to be accessed. These units in turn are coupled by long-distance conductors 20–26 to like receiving and transmitting units 28 and 30, which are located proximate peripheral devices, such as a keyboard 39 or a digitizer, "mouse," or the like, these peripheral devices also being provided with bidirectional open collector clock and data ports 32 and 34, respectively, which, by virtue of LRU units 28 and 30, may be accessed. For purposes of this discussion and for brevity, it is assumed that a keyboard 39 is being utilized; however, this invention is by no means limited to keyboard communication links and is applicable to any bidirectional open collector communications links. Further, while circuitry of the present invention is shown disembodied from components of a digital system, such circuitry may be incorporated in the port circuitry of the respective components.

In a first illustrated usage of the present invention (FIG. 1) wherein separate power supplies power the computer and keyboard, optical isolation, as specifically illustrated in FIG. 5, is utilized to isolate the respective power supplies. Here, respective pairs of long-distance signal conductors 20, 22 and 24, 26 for each of the clock and data ports extend between units 16 and 18, are operatively associated (not through long-distance lines) with computer 10, and units 28 and 30 are operatively associated with keyboard 39.

In another usage (FIG. 1A), no optical isolation is employed, with circuitry of the present invention being utilized as repeater units in an extended open collector communications link. Here, a single long-distance conductor 36, 38 for each of the clock and data lines, respectively, extends between the computer and peripheral devices, with combined receiver and transmitter units constructed as an integral unit 41, for example, LRU units 16 and 28 of FIG. 1 are positioned at appropriate intervals in conductors 36, 38. In this embodiment, power and ground potentials for unit 41 are supplied from a keyboard power port associated with computer 10.

Turning now to FIG. 2, which shows a diagram illustrative of the function of a communications link 40 of the present invention following FIG. 1 wherein a first LRU unit 43 is coupled at end 44 of link 40, and an identical, second and receiving and transmitting unit 63 is coupled at an opposite end 41 of link 40. This follows the system specifically illustrated in FIG. 1. Thus, open collector signals from port 48 are transmitted to LRU 63 via long-distance conductor 78, with unit 63 coupling the signals to port 66. Likewise, unit 43 receives transmitted open collector signals from unit 63 via long-distance conductor 61 responsive to signals from port 66 and couples them to port 48. During transmission of an open collector signal from either of units 43 or 63, as, for example, an open collector signal transmitted from LRU 43 on long-distance conductor 78, the opposite LRU, LRU 63, generates a control signal and applies it to long-distance conductor 61, which control signal is used to apply a threshold above a noise floor the open collector signal from port 48 must cross to effect switching of a logic transition, as will be described. The same is true of LRU 43.

Receiving and transmitting LRU 43, which may be responsive to an open collector port of computer 10 of FIG. 1, is provided with a comparator 42 having a noninverting input 46 coupled to open collector port 48. A diode 50, which may be a germanium diode, and having a voltage drop, when forward biased, on the order of about 200 millivolts, has an anode coupled to noninverting input 46 of comparator 42 and a cathode coupled to inverting input 52 of comparator 42. Coupled as such, diode 50 becomes conductive when a potential from port 48 applied to noninverting input 46 rises about 200 millivolts above a potential applied to inverting input 52. Also coupled to inverting input 52 is an adjustable voltage source 54, coupled to an end of conductor 61, which provides a first reference potential via current limiting resistor 56 on the order of about 800 millivolts. This potential of 800 millivolts is selected to be above any noise floor that may be present and is higher where the environment presents a relatively large quantity of signal noise and may be lower in a less noisy environment. A diode 58 coupled to conductor 61 is poled to pass current from inverting input 52 and source 54 and serves to provide voltage control over the output of source 54, as will be explained.

Likewise, receiving and transmitting LRU 63 is responsive to an open collector port, such as an open collector port of keyboard 39 (FIG. 1), and is provided with a comparator 62, with the noninverting input of comparator 62 coupled to port 66. A diode 68, which also may be a germanium diode, is poled between the inverting and noninverting input of comparator 62 such that current is passed as a potential at port 12 falls below about 200 millivolts below a potential applied to inverting input 70. A second adjustable voltage source 72 of unit 41 is coupled to one end of conductor 78 via resistor 74 and provides a current limited potential of about 800 millivolts to inverting input 70 of comparator 62. A second diode 76 is coupled to conductor 78 as described for diode 58 and passes current from inverting input 70 and supplied by source 72.

As the signals passed between LRUs 48 and 66 are voltage transitions, no attempt is made to match impedance of the control signals to a characteristic impedance of conductors 61 and 78 or to impedances of the open collector ports. However, as will be further explained, impedances of conductors coupling the ports and the noninverting inputs of the comparators may be modified to emulate impedances of peripheral devices normally coupled to the ports.

Responsive to a LOW from port 48 falling below about 800 millivolts, the threshold set by the potential from source 54, the output of comparator 42 develops a LOW. This LOW is applied to conductor 78, causing diode 76 to conduct and drawing the reference potential from source 72 to a second reference potential of about 200 millivolts, the drop across diode 76. This second reference potential is applied to inverting input 70 of comparator 62, resulting in the HIGH logic potential from port 66 being drawn to a LOW potential of about 400 millivolts through diode 68, the 400 millivolts being the combination of the 200 millivolts from source 72 across diode 76 and the drop of diode 68. This asserts a LOW at port 66 and generates a HIGH output from comparator 62, which is applied to conductor 61. As a 200 millivolt difference is maintained between the inverting input and noninverting input of comparator 62, the output of comparator 62 is clamped at the HIGH output. This HIGH reverse biases diode 58, maintaining the 800 millivolt threshold from source 54 at inverting input 52 of comparator 42.

Transmission of open collector signals from port 66 is as described for transmission of signals from port 48. As such, the first potential of about 800 millivolts from source 72 serves as a switching reference, which establishes a voltage threshold of about 800 millivolt at the inverting input of comparator 62 that the potential of the signal from port 66 must fall below in order to trigger comparator 62 to develop a LOW output. The LOW from comparator 62 is applied to long-distance conductor 61, biasing diode 58 into conduction and draining current from source 54 and port 48, in turn lowering the reference potential of source 54 to the second reference potential of about 200 millivolts and asserting a LOW potential of about 400 millivolts at port 48.

It is noted that when one of the ports effects a data transition, the control signals are always of opposite logical values; and when the ports are at the same logical value, the control signals are of like logical values. Additionally, conductors 61 and 78 of a unit such as LRU 41 may be any length as required, with lengths of 1,000 feet or more adequately passing the open collector signals.

When utilized as repeating and/or regenerating units, circuitry as represented by LRUs circuitry 40 of a unit 41 is typically constructed integrally in a small housing, with noninverting input 46 of comparator 42 being coupled to a first remotely located open collector port via a first long-distance conductor 38 (FIG. 1A), and noninverting input 64 of comparator 62 being coupled to a second remotely located open collector port via a second long-distance conductor 38a, as shown in FIG. 1A coupled to the ports.

Turning now to FIG. 3, a second of the four other and specific embodiments is shown. Here, LRU 91, a different version of LRU 41, is provided with a comparator 90 having a noninverting input 92 coupled to open collector port 94 and to a resistor 96. Resistor 96 is coupled to a voltage source, such as +5 volts, with resistance of resistor 96 selected to emulate impedance of a particular device coupled to port 94. For example, if port 94 is a keyboard data port of a computer, resistance of resistor 96 is selected to be about 2.2 K ohms, a typical resistance of a clock or data port of a keyboard. An anode of a Shottkey diode 98, which has a voltage drop of about 400 millivolts, is coupled to noninverting input 92, with a cathode of diode 98 coupled to an output of tristate buffer 100. An input of buffer 100 is coupled to ground, with an enabling, active LOW input 101 coupled to a long-distance conductor 116, from which a control signal is received from comparator 118 in unit 119, a version of unit 41. A midpoint of a voltage divider network 104 is coupled to inverting input 102 of comparator 90 and serves to establish a voltage threshold, which, depending on any noise floor that may be present as described above, is on the order of 800 millivolts. In the instance of a +5 volt supply, voltage divider network 104 is composed of a resistor 106 of about 60 K ohms coupled to power and a resistor 108 of about 10 K ohms coupled to ground. As such, values of resistances of network 104 are selected to provide about 800 millivolts to inverting input 102 of comparator 90, but this threshold may be adjusted by changing the values of resistors 106 and 108. Further coupled to inverting input 102 of comparator 90 and to voltage divider network 104 is an output 110 of tristate buffer 112, which has an input coupled as shown to ground. The enabling, active LOW input 114 of buffer 112, as with buffer 100, is taken from long-distance conductor 116, which, as stated, receives the control signal from the output of comparator 118 of unit 119.

Comparator 118 is coupled at its noninverting input 120 to open collector port 122, which is remotely located from port 94. A second Shottkey diode 124 having a 400-millivolt drop thereacross as shown and described for diode 98 is coupled at its anode to noninverting input 120 of comparator 118, with the cathode of diode 124 coupled to an output of tristate buffer 125. An input of buffer 125 is coupled to a ground potential, and an active LOW, enabling input 127 is coupled to long-distance conductor 129 and receives a control signal from the output of comparator 90. Coupled to inverting input 126 of comparator 118 is a midpoint of voltage divider network 130, which, like voltage divider network 104, is constructed of a 60 K ohm resistor 132 coupled to the +5-volt power source and a 10 K-ohm resistor 134 coupled to ground, with values of the resistors selected to provide a switching threshold of about 800 millivolts at comparator 118. As stated, this threshold is selected to be above any noise floor that may be present. A midpoint of divider network 130 is coupled to inverting input 126 of comparator 118 and to an output of tristate buffer 136. An input of buffer 136 is coupled to a ground potential, and an enabling, active LOW input 138 is coupled to long-distance conductor 129 to receive the control signal from comparator 90. Where the circuitry of FIG. 3 is to be utilized as a repeater and regeneration unit, the circuitry of FIG. 3 is integrally constructed, with a first long-distance conductor coupling port 94 to the LRU's circuitry, and a second long-distance conductor coupling port 22 to the LRU's circuitry.

Operation of the embodiment of FIG. 3 initially assumes a quiescent, HIGH logic state at both ports 94 and 122. In this condition, a HIGH logic state, which may be of about +5 volts, is applied to noninverting inputs 92 and 120 of comparators 90 and 118, respectively, causing comparators 90 and 118 to each develop a HIGH control signal output. These HIGH control signals from comparators 90 and 118 are applied to long-distance conductors 129 and 116, respectively, which in turn disables tristate buffers 136, 125 and tristate buffers 100 and 112, respectively. With buffers 100 and 112 disabled, and presenting a HIGH-Z, or high impedance logic state, to the inputs of comparator 90, the HIGH from port 94 is applied to the noninverting input 92 of comparator 90, with the 800-millivolt potential from voltage divider 104 applied to the inverting input. With these inputs, comparator 90 develops and maintains a HIGH control signal. A like situation exists with respect to comparator 118, with the HIGH from port 122 applied to noninverting input 120 and the 800 millivolt potential from voltage divider 130 applied to inverting input 126. This serves to develop and maintain a HIGH control signal from comparator 118 to disable buffers 100 and 112.

Assuming a LOW transition from either of ports 94 or 122, and assuming port 94 initially develops a LOW, when the transition voltage from port 94 falls below the voltage of about 800 millivolts from divider 104, comparator 90 develops a LOW control signal, which is applied to conductor 129. This LOW enables buffers 125 and 136, with buffer 136 drawing the 800-millivolt potential from divider network 130 down to a LOW of about 0 volts, which is applied to inverting input 126 of comparator 118. Similarly, buffer 125 draws the HIGH logic state from port 122 down to a LOW potential equivalent to the diode drop, or about 400 millivolts, of diode 124, which LOW constituting a LOW logic state applied to port 122 and noninverting input 120 of comparator 118. This difference of 400 millivolts between inverting and noninverting inputs of comparator 118 maintains a HIGH control signal output from comparator 118, which disables buffers 90 and 112 and insures that the output of comparator 100 is clamped LOW as described.

In a like manner, a LOW transition from port 122 applied to noninverting input 120 of comparator 118 causes comparator 118 to develop a LOW as the falling transition potential crosses the 800 millivolt threshold applied to inverting input 126. This LOW control signal from comparator 118 and applied to conductor 116 enables buffers 100 and 112, which in turn draw the potential at port 94 and noninverting input 92 down to the 400-millivolt potential of the diode drop across diode 98, transferring the LOW logic potential from port 122 to port 94. Additionally, the first 800-millivolt reference potential from voltage divider network 104 is reduced by buffer 112 to the second reference potential of near 0 volts. This causes comparator 90 to be clamped at a HIGH control signal output, causing buffers 125 and 136 to develop a HIGH-Z state, which in turn applies 800 millivolts from divider 130 to inverting input 126 of comparator 118, establishing an 800-millivolt threshold applied thereto and clamps comparator 118 LOW until the LOW from port 122 is removed. In the event that spurious noise is present at input 120 of comparator 118, the 800-millivolt threshold established by divider 130 prevents such noise from false triggering of comparator 118.

Turning now to FIG. 4, a third implementation of the present invention is shown, with transmitter and receiver units 150 and 152 of the present invention functioning identically to each other and coupled to open collector ports 154 and 156, respectively. Like components of unit 152 with respect to unit 150 bear like reference numerals and the suffix "a." Units 150 and 152 are powered by a power conductor 151 extending between units 150 and 152; and in the case of a computer and keyboard being coupled to the long-distance link, power conductor 151 is coupled to the computer, which supplies power from the keyboard power port located thereon. A ground potential may be supplied to the units from a separate conductor, as in the case of a logic ground, or through a grounded sheath in a cable housing conductors coupling units 150 and 152, as in the case of a chassis ground.

In this embodiment, and by way of example, a low-going pulse from port 154 is applied via resistor 158 of about 10 K ohms to base 160 of PNP transistor 162. Emitter 164 of transistor 162 is coupled to a midpoint of a voltage divider unit 166 constructed of resistors 167 and 169 having resistances of 510 ohms and 1.5 K ohms, respectively, which provides a bias reference voltage of about 2.1 volts to emitter 164. As the voltage drop across the base-emitter junction of transistor 162 is about 600 millivolts, a switching threshold of about 1.5 volts is established at base 160 of transistor 162 that a falling potential from port 154 falls through, saturating transistor 162. Collector 168 of transistor 162 is coupled to base 170 of NPN transistor 172, which in turn has an emitter 174 coupled to ground and a collector 176 coupled to a long-distance conductor 178, which couples unit 150 to unit 152.

In unit 152, a cathode 180a of Shottkey diode 182a is coupled to conductor 178, with an anode of diode 182a coupled to port 156 and through resistor 158a to base 160a of transistor 162a. Diode 182a has a voltage drop of about 400 millivolts and is responsive to the collector-emitter impedance of transistor 172. Likewise, corresponding diode 182 in unit 150 is coupled to long-distance conductor 179, which connects to collector 176a of transistor 172a in unit 152. Diode 182 is responsive to the emitter-collector impedance of transistor 172a of unit 152 and is coupled between a resistor 184 of about 2.2 K ohms and resistor 186 of about 1 K ohms. As described, resistors 184 and 186 emulate impedances of a keyboard and computer, respectively, with resistors 186 and 186a providing some current flow to stabilize a potential applied to emitter 164 of transistor 162.

Operation of this embodiment is assumed to begin with a low-going transition from port 154, applying a LOW to base 160 of transistor 162. As the LOW from port 154 falls below the 1.5-volt threshold at base 160 of transistor 162, transistor 162 becomes saturated, applying a voltage of about 1.9 volts (2.1 volts minus the emitter-collector drop of about 200 millivolts of transistor 162) from voltage divider 166 to base 170 of transistor 172. This biases transistor 172 to a conductive state, in turn forward biasing diode 182a of unit 152 and establishing a current path through diode 182a, long-distance conductor 178, and transistor 172. As a result, the quiescent, HIGH potential from port 156 is lowered to a logical LOW of about 600 millivolts, equal to the voltage drop of about 400 millivolts across diode 182a and the 200 millivolt drop across transistor 172. Additionally, the potential applied to base 160a of transistor 162a is reduced to the same potential of about 600 millivolts, draining current from voltage divider network 166a to ground through transistor 172, reducing the reference potential applied to emitter 164a of transistor 162a to about 200 millivolts. This biases transistor 162a OFF, in turn biasing transistor 172a to a high impedance state. With transistor 172a OFF, potential from voltage divider 166 of unit 150 is applied to emitter 164 of transistor 162 and passed by transistor 162 to base 170 of transistor 172 as described.

When the LOW from port 154 transitions to a HIGH state, and as the transition voltage rises above the threshold of about 1.5 volts, transistor 162 reverts to a high impedance state, lowering a potential applied to base 170 of transistor 172 and biasing transistor 172 to a nonconductive state. This in turn blocks current flow through conductor 178 and diode 182a, allowing port 156 to assert a quiescent HIGH potential to voltage divider 166a of unit 152 to again provide about 2.1 volts reference potential bias to emitter 164a of transistor 162a. Operation of unit 152 when a LOW is received from port 156 is identical for that described for unit 150.

In the instance where a final clock pulse in a sequence of clock pulses is transmitted from one port, port 154, and the other port, port 156, asserts a LOW, port 154, having first asserted a LOW logic state, causes port 156 to be clamped LOW as described regardless of a logic state asserted by port 156. This occurs because unit 152 is clamped LOW by virtue of transistor 162 being biased OFF, saturating transistor 172 and forward biasing transistor 182a as described. As port 154 reverts to a HIGH state, the rising logic transition provides increasing voltage to the base of transistor 162, biasing it toward a less conductive state and in turn biasing transistor 172 to a less conductive state, causing less current to flow through diode 182a. Concurrently, this allows increasing voltage to be applied to the emitter of transistor 162a, biasing it toward conduction and applying a rising voltage to the base of transistor 172a, driving it toward conduction and reversing the clamp so that port 154 becomes clamped LOW. Thus, in a situation where both ports are asserting a LOW logic state, the port that initially goes LOW clamps the other port LOW regardless of a logic state from that port; and if the port that initially went LOW attempts to revert to a HIGH state, the clamp reverses. This prevents a situation where each port holds the other port LOW, preventing any further communications.

In the embodiment shown in FIG. 5, identical reference numerals are utilized for identical components as shown in FIG. 4. Also, the structures of FIG. 5 are similar to those of FIG. 4, with the exception that unit 150 is powered from a primary source of power located proximate port 154, such as a keyboard power terminal and respective reference ground potential, and unit 152 is powered from a secondary source of power, such as an auxiliary power supply and respective reference ground proximate port 156. In use, some electrical environments may have voltage offsets inherent in the ground or power potentials that would otherwise prevent use of a separate, discrete power supply for a keyboard remotely located from a computer.

Here, optical isolators 200 and 200a are incorporated as shown in units 150 and 152, respectively, and serve to optically isolate offset power or ground potentials that ordinarily would disrupt or prevent communications equipment connected by discrete conductors and having separate power supplies from operating. In unit 150 of FIG. 5, collector 202 of photosensitive transistor 204 is coupled to the cathode of diode 182. Emitter 206 of transistor 204 is coupled to primary ground and to a 1-megohm noise suppression resistor 208 bridging emitter 206 and base 210 of photosensitive transistor 204. A light emitting diode (LED) 212 in optical isolator 200 has its anode coupled to secondary power in unit 152 via current limiting resistor 214a and a first long-distance conductor 216a. A cathode of LED 212 is coupled to collector 176a of transistor 172a via a second long-distance conductor 218a, with the emitter of transistor 176a coupled to secondary ground. Likewise, in unit 152, a collector of photosensitive transistor 200a is coupled to the cathode of diode 182a, with emitter 206a coupled to secondary ground and to a 1-megohm noise suppression resistor 208a. A third long-distance conductor 216 coupled to an anode of LED 212a extends to resistor 214 of unit 150, which resistor is coupled to primary power in unit 150. A fourth long-distance conductor 218 extends between the cathode of LED 212a in unit 152 to collector 176 of transistor 172 in unit 150, with an emitter of transistor 172 coupled to a primary ground potential.

Operation of the embodiment of FIG. 5 assumes port 154 developing a logical LOW, with this LOW applied to base 160 of transistor 162 via current limiting resistor 158. This LOW saturates transistor 162, in turn saturating transistor 172 as described. With transistor 172 saturated, LED 212a in unit 152 is forward biased, causing current from the primary voltage source to flow through resistor 214 and conductor 216 to unit 152, where it illuminates LED 212a. A return path for the current flow to LED 212a is provided through conductor 218 and transistor 172 to primary ground. Light from diode 212a saturates photosensitive transistor 200a, causing current to flow through diode 182a and photosensitive transistor 204a to the secondary ground in unit 152, which causes a LOW of about 600 millivolts to be applied to port 156. Additionally, current is drained from voltage divider unit 166a through photosensitive transistor 204a, which reduces bias potential applied to emitter 164a of transistor 162a to about 400 millivolts, the voltage drop across optical transistor 204a. This insures that transistors 162a and 172a will be held in a nonconductive state.

Figure 6:
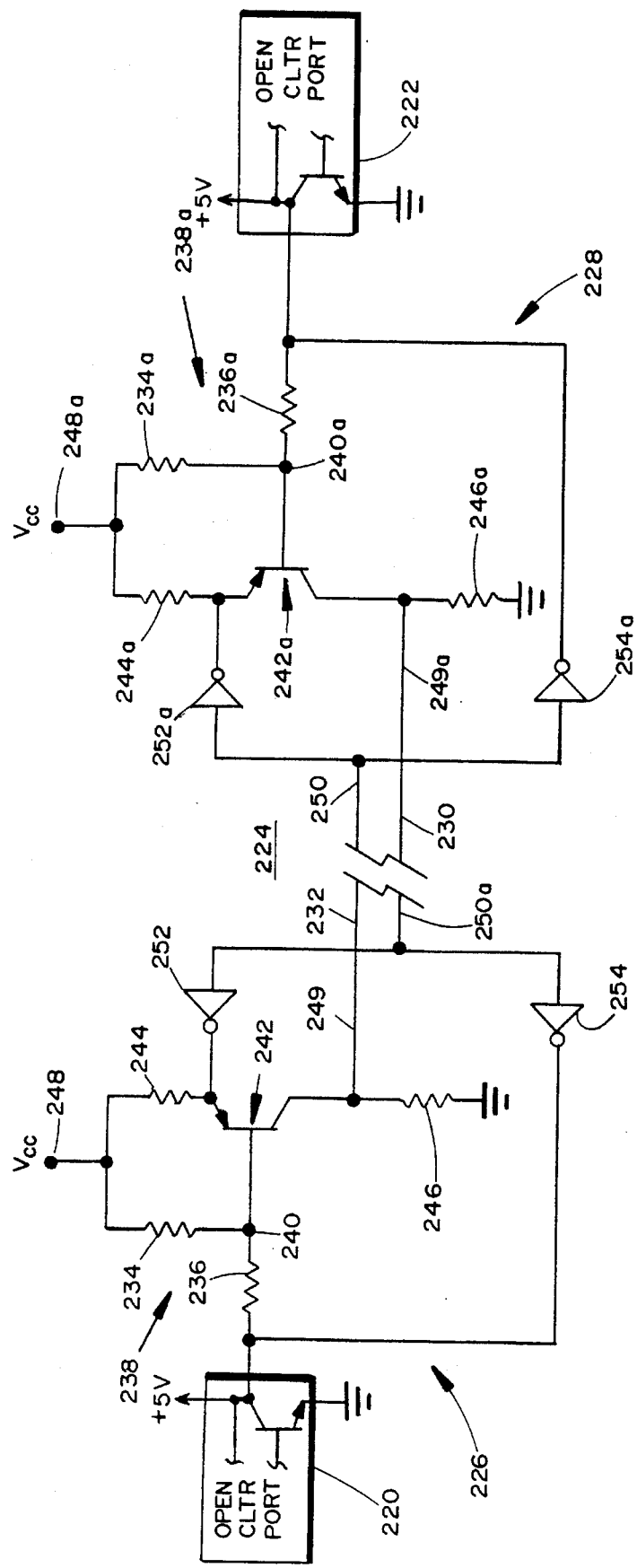
FIG. 6 is a schematic diagram of a fifth embodiment thereof.

In yet another embodiment of the present invention, and as shown in FIG. 6, open collector ports 220 and 222 are connected by a long-distance link 224. In this embodiment, a receiving and transmitter unit 226 coupled to open collector port 220 passes digital signals and a control signal to receiving and transmitting unit 228 coupled to open collector port 222. Long-distance conductors 230 and 232 may span a distance of at least 1,000 feet between units 226 and 228 and serve to pass the digital signals and control signals between the ports. Units 226 and 228 are identical, with like components of unit 228 to those of unit 226 designated by identical reference numerals and the suffix "a."

In use, units 226 and 228 may be constructed integral or closely proximate each other or at appropriate intervals along very long conductors or spaced apart along the conductors between ports 220 and 222, as differentiated by FIGS. 1 and 1A. Additionally, units 226 and 228 may be respectively positioned proximate or at each of ports 220 or 222.

In unit 226, resistor 234 is coupled to a source of power 248, such as 5 volts, and resistor 236 is coupled to port 220. These resistors form a voltage divider network 238, with a terminal 240 being common to resistors 234 and 236. Network 238 proportions a falling logic transition from port 220 such that as the falling logic transition reaches 1.12 volts, a voltage of about 4.4 volts is produced at junction 240. This proportioned voltage at port 220 serves as a threshold at 1.12 volts, which applies 4.4 volts to a base input of PNP transistor 242, with an emitter thereof coupled via resistor 244 to the source of power 248. The values of resistors 234 and 236 may be chosen so as to provide a transition threshold at an open collector port which is above any noise level or ground offset that may be present. A collector of transistor 242 is coupled via resistor 246 to a ground reference potential, with end 249 of extended conductor 232 connected between the collector of transistor 242 and resistor 246. Coupled as described, transistor 242 serves as a comparator to compare the potential at the emitter of transistor 242 and the voltage from port 220 and to switch the potential at the emitter to the collector responsive to the open collector potential from the port falling below 1.12 volts, corresponding to 4.4 volts applied to the base of transistor 242.

At the quiescent HIGH logic level from port 220, transistor 242 is biased to a nonconductive state, causing a LOW logic potential to be applied to end 249 of conductor 232. During a falling, active LOW logic transition, the logic potential from port 220 falls below 1.12 volts, which develops a proportioned voltage of about 4.4 volts applied to the base of transistor 242, causing transistor 242 to be driven into conduction. As the logic transition from port 220 continues to fall, transistor 242 becomes saturated and allows current to flow to the collector of transistor 242. This results in a voltage rise across resistor 246, which develops a HIGH logic level, which is applied to end 249 of conductor 232.

At port 222, and as stated, unit 228 is identically constructed, with resistors 234a and 236a forming divider network 238a. Divider network 238a, like network 238, proportions the voltage at junction 240a so that as a falling, active LOW logic transition from port 222 reaches 1.12 volts, a 4.4-volt threshold is developed at junction 240a. This voltage is applied to the base of transistor 242a, with an emitter of transistor 242a coupled to power source 248a and a collector of transistor 242a coupled to a ground reference potential via resistor 246a. End 249a of conductor 230 is coupled between resistor 246a and the collector of transistor 242a and receives the voltage potential developed across resistor 246a.

As described for unit 226, as an active LOW logic transition from port 222 falls below 1.12 volts, the falling potential from network 238a drops below the 4.4 volt threshold at junction 240a. This biases transistor 242a to a conductive state, supplying current from current source 248a to resistor 246a. A quiescent HIGH logic potential is generated across resistor 246a, which HIGH potential being applied to end 249a of conductor 230. Conversely, a quiescent HIGH logic potential from port 222 biases transistor 242a to a non-conductive state, developing a LOW logic potential across resistor 246a and applying a LOW to end 249a of conductor 230.

At unit 226, end 250a of conductor 230 is coupled to inputs of open collector inverters 252 and 254, with an output of inverter 252 coupled to the emitter of transistor 242, and the output of inverter 254 coupled to port 220. Inverters 252 and 254 are open collector inverters, which provide a low impedance output to a common ground potential responsive to a HIGH input and a HIGH Z impedance responsive to the input being pulled to a LOW logic level. In this application, the inverters serve to receive a logic signal somewhat degraded by long conductors, and provide a regenerated open collector logic signal.

Coupled as described, a HIGH developed across resistor 246a, corresponding to a LOW from port 222, is applied to the inputs of inverters 252 and 254 and translated to a LOW logic potential thereby. The LOW potential from inverter 254 drains current flow from port 220, communicating a LOW logic level to port 220. The LOW potential from inverter 252 is applied to the emitter of transistor 242, which drains bias potential from the emitter and clamps transistor 242 in a non-conductive state. These LOW logic states at the emitter of transistor 242 and port 220 are maintained until the LOW from port 222 transitions to a HIGH logic level.

The opposite end 250 of conductor 232 is coupled to inputs of digital open collector inverters 252a and 254a, with the output of inverter 254a coupled to port 222 and the output of inverter 252a coupled to the emitter of transistor 242a. As such, an active LOW from port 220 drives transistor 242 into saturation, applying a HIGH to the input of inverters 254a and 252a. This HIGH logic potential is translated to a LOW potential by inverters 252a and 254a, with inverter 254a draining current from port 222, developing a LOW logic potential and communicating the LOW from port 220 to port 222. Inverter 252a, as described, drains current from the emitter of transistor 242a, clamping transistor 242a in a non-conductive state.

In operation, and with both ports at a quiescent HIGH logic level, it is assumed that port 220 develops an active LOW logic signal. As this LOW falls to about 1.12 volts, transistor 242 begins to conduct as the base voltage falls to 4.4 volts, 0.6 volt below the emitter voltage of 5 volts. This allows current to flow through resistor 246, developing a HIGH logic level thereacross. This HIGH is applied to inputs of open collector inverters 252a and 254a via conductor 232, with inverters 252a and 254a translating the HIGH logic level to a LOW logic level. Thus, inverter 254a drains current from port 222, pulling it LOW and communicating a LOW logic signal to port 222. Inverter 252a drains current from the emitter of transistor 242a, clamping it in a non-conductive state.

With transistor 242a clamped nonconductive, a LOW logic potential is applied to inverters 252 and 254, which is translated by each inverter to a HIGH Z state. This allows voltage from source 248 to be applied to the emitter of transistor 242, saturating the transistor as long as port 220 continues to assert the LOW potential.

Upon port 220 transitioning to a quiescent HIGH logic state, transistor 242 is biased to a non-conductive state, developing a LOW across resistor 246. This LOW is applied to inverters 252a and 254a via conductor 232, translating the LOW logic level to a HIGH Z state and allowing bias potential from source 248a to be applied to transistor 242a.

Communications from port 222 to port 220 are as described for those occurring from port 220 to port 222, with a potential from port 222 being proportioned and applied to the base of transistor 242a via network 238a. As the logic transition falls below the reference potential of 1.12 volts, transistor 242a begins to conduct and is saturated as the voltage from port 222 continues to fall. This allows current to flow through transistor 242a and develops a voltage drop corresponding to a HIGH logic potential across resistor 246a. This HIGH is applied to inputs of inverters 252 and 254, which translate the HIGH to a LOW potential; inverter 254 draining current from port 220, communicating the LOW thereto, and inverter 252 draining current from the emitter of transistor 242, clamping it in a non-conductive state. The resulting LOW from transistor 242 being biased OFF is applied to inverters 252a and 254a, with inverter 252a developing a HIGH Z output having no effect on transistor 242a until the LOW logic level from port 222 is removed.

Since circuitry breaks can be employed as shown by either FIG. 1 or FIG. 1A, FIGS. 2, 3, 4, and 6 illustrate dual breaks, being between a port and a comparator and between comparators. In practice, only a single type break would be employed.

Further, for purposes of simplification, ground connections are discretely made. In practice, a ground conductor would connect between the units of the drawings, it paralleling the conductors shown broken in the drawings. Of course, such is not necessary for FIG. 5 where complete connective circuits are shown between units.

Having thus described my invention and the manner of its use, it is apparent that incidental modifications may be made thereto that fairly fall within the scope of the following appended claims, wherein I claim:

1. A binary logic communications link comprising:

a first bidirectional, binary logic communications port and a remotely located second bidirectional, binary logic communications port;

a first conductor having a first end and a second end;

a second conductor having a first end and a second end;

first comparator means responsive to said first port for providing a first digital transition to said first end of said first conductor responsive to a first digital potential transition from said first port crossing a selected potential;

second comparator means responsive to said second port for providing a second digital transition to said first end of said second conductor responsive to a digital potential transition from said second port crossing a selected potential;

first voltage control means for providing a first logic level voltage;

second voltage control means for providing a first logic level voltage;

said second voltage control means being coupled to said second end of said first conductor and coupled to said second port and responsive to a said first digital transition from said first conductor and said first comparator means for asserting a said first logic level voltage at said second port, thereby communicating a said first digital transition from said first port to said second port;

said first voltage control means being coupled to said second end of said second conductor and coupled to said first port and being responsive to a said second digital transition from said second conductor and said second comparator means for asserting a said first logic level voltage at said first port, thereby communicating a second digital transition from said second port to said first port;

said second voltage control means includes means further responsive to said second end of said first conductor for effecting clamping of an output of said second comparator means to a second logic level state until said digital potential transitions asserted by said first port reverts to a quiescent logic level; and said first voltage control means is further responsive to said second end of said second conductor for effecting a clamping of an output of said first comparator means to a second logic level state until said first digital potential transition asserted by said first port reverts to a quiescent logic level.

2. A communications link as set forth in claim 1 wherein said first and second voltage control means each includes a diode coupled to a said comparator and poled inverse to current flow from a said comparator.

3. A communications link as set forth in claim 1 wherein:

said first voltage control means includes:
 a first diode poled to pass current flow from said first port, and
 a first switching device having a first switched terminal coupled to said first diode, a second switched terminal coupled to a common potential, and a control terminal coupled to said second end of said second conductor; and wherein said second voltage control means comprises:
 a second diode poled to pass current flow from said second port, and
 a second switching device having a first switched terminal coupled to said second diode, a second switched terminal coupled to a common potential, and a control terminal coupled to said second end of said first conductor, whereby a potential applied to one of said control terminals responsive to a first digital transition from a said comparator means enables current flow through a said diode, reducing a voltage level of a said port to an active low logic level.

4. A communications link as set forth in claim 3 wherein each said first and second switching devices comprises a tristate buffer.

5. A communications link as set forth in claim 1 wherein said link comprises:

a first optical isolator having an illuminator coupled to said second end of said second communications conductor and an output coupled to said first voltage control means; and a second optical isolator having an illuminator coupled to said second end of said first communications conductor and an output coupled to said second voltage control means.

6. A communications link as set forth in claim 1 wherein:

said second voltage control means comprises a first inverter coupling said second end of said first conductor to said second comparator means, and a second inverter coupling said second end of said first conductor to said second port; and said first voltage control means comprises a third inverter coupling said second end of said second conductor to said first comparator means, and a fourth inverter connecting said second end of said second conductor to said first port.

7. A binary logic communications link comprising:

a first bidirectional, binary logic communications port and a remotely located second bidirectional, binary logic communications port;

a first conductor having a first end and a second end;

a second conductor having a first end and a second end;

first comparator means responsive to said first port for providing a first digital transition to said first end of said first conductor responsive to a first digital potential transition from said first port crossing a selected potential and to the occurrence of said first digital transition appearing at said second end of said second communications conductor; and second comparator means responsive to said second port for providing a second digital transition to said first end of said second conductor responsive to a second digital transition from said second port crossing a selected potential and to the occurrence of said second digital potential appearing at said second end of said first conductor.

8. A communications link as set forth in claim 7 wherein said first and second conductors are each long-distance communications conductors.

9. A communications link as set forth in claim 7 wherein said first port and said first comparator are connected by a first long-distance communications conductor, and said second port and said second comparator are connected by a second long-distance communications conductor.

* * * * *